United States Patent
Tang et al.

(10) Patent No.: US 10,439,011 B2
(45) Date of Patent: Oct. 8, 2019

(54) OLED DISPLAY SUBSTRATE AND MANUFACTURING METHOD THEREOF, OLED DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Shuo Tang, Beijing (CN); Jinrong Zhao, Beijing (CN); Peng Sun, Beijing (CN); Bin Feng, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/572,764

(22) PCT Filed: May 19, 2017

(86) PCT No.: PCT/CN2017/085013
§ 371 (c)(1),
(2) Date: Nov. 8, 2017

(87) PCT Pub. No.: WO2018/058974
PCT Pub. Date: Apr. 5, 2018

(65) Prior Publication Data
US 2018/0286933 A1    Oct. 4, 2018

(30) Foreign Application Priority Data
Sep. 27, 2016    (CN) .......................... 2016 1 0853357

(51) Int. Cl.
*H01L 27/32*    (2006.01)
*H01L 51/52*    (2006.01)
(Continued)

(52) U.S. Cl.
CPC .......... *H01L 27/3246* (2013.01); *H01L 27/12* (2013.01); *H01L 27/3262* (2013.01);
(Continued)

(58) Field of Classification Search
CPC ....................................................... H01L 27/30
See application file for complete search history.

(56) References Cited

U.S. PATENT DOCUMENTS

2006/0243976 A1 *  11/2006  Shin .................... H01L 27/3244
                                                    257/59
2008/0143255 A1    6/2008  Lee et al.
(Continued)

FOREIGN PATENT DOCUMENTS

CN    101202299 A    6/2008
CN    104716166 A    6/2015
(Continued)

OTHER PUBLICATIONS

Search Report for International Patent Application No. PCT/CN2017/085013 dated Jul. 27, 2017.

*Primary Examiner* — Cheung Lee
(74) *Attorney, Agent, or Firm* — Calfee, Halter & Griswold LLP

(57) ABSTRACT

An OLED display substrate is provided. The OLED display substrate includes a substrate, a source-drain electrode layer and a first electrode layer above the substrate, a light-emitting layer, a second electrode layer, wherein the source-drain electrode layer and the first electrode layer are at the same layer. Additionally, an OLED display panel is provided. The OLED display panel includes such OLED display substrate as well as a method for manufacturing such OLED display substrate.

19 Claims, 2 Drawing Sheets

(51) Int. Cl.
*H01L 51/00* (2006.01)
*H01L 51/50* (2006.01)
*H01L 51/56* (2006.01)
*H01L 27/12* (2006.01)

(52) U.S. Cl.
CPC ...... *H01L 51/0097* (2013.01); *H01L 51/5056* (2013.01); *H01L 51/5092* (2013.01); *H01L 51/5203* (2013.01); *H01L 51/56* (2013.01)

(56) References Cited

U.S. PATENT DOCUMENTS

| | | | |
|---|---|---|---|
| 2009/0278449 A1 | 11/2009 | Choi et al. | |
| 2013/0146878 A1* | 6/2013 | Oh | H01L 51/5265 257/59 |
| 2014/0098005 A1* | 4/2014 | Kim | G06F 3/1446 345/1.3 |
| 2015/0255740 A1* | 9/2015 | Nakada | H01L 51/0097 257/40 |
| 2016/0028043 A1* | 1/2016 | Kwon | H01L 51/5253 257/40 |
| 2017/0352534 A1 | 12/2017 | Liu | |

FOREIGN PATENT DOCUMENTS

| | | | |
|---|---|---|---|
| CN | 105097845 A | 11/2015 | |
| CN | 106129104 A | 11/2016 | |

\* cited by examiner

OLED DISPLAY SUBSTRATE AND MANUFACTURING METHOD THEREOF, OLED DISPLAY PANEL

RELATED APPLICATION

This application is the U.S. national phase entry of PCT/CN2017/085013, with an international filing date of May 19, 2017, which claims priority to the Chinese patent application No. 201610853357.3 filed on Sep. 27, 2016, the entirety of which is incorporated herein by reference.

FIELD

The present disclosure generally relates to the field of display, and in particular to an Organic Light-Emitting Diode (OLED) display substrate, an OLED display panel comprising such an OLED display substrate, and a method of manufacturing such an OLED display substrate.

BACKGROUND

The Organic Light-Emitting Diode (OLED) display technology is a technology that realizes display by means of reversible discoloration generated by light-emitting materials under the driving of current. An OLED display has advantages such as ultra-light, ultra-thin, high brightness, large viewing angle, low voltage, low power consumption, quick response, high definition, shake-proof, bendable, low cost, simple process, using few raw materials, high light-emitting efficiency and wide range of temperature, and is considered as the most promising new-generation display technology.

SUMMARY

An object of the present disclosure is to provide an improved OLED display substrate, an OLED display panel comprising such an OLED display substrate, and a method of manufacturing such an OLED display substrate.

According to one aspect of the present disclosure, an OLED display substrate is provided. The OLED display substrate comprises a substrate, a source-drain electrode layer and a first electrode layer above the substrate, a light-emitting layer, and a second electrode layer, wherein the source-drain electrode layer and the first electrode layer are at the same layer.

As will be appreciated by those skilled in the art who have benefited from the present disclosure, above-mentioned OLED display substrate may further comprise a hole injection layer, a hole transport layer, an electron injection layer, an electron transport layer, a barrier layer, etc.

In some embodiments, the display substrate further comprises a passivation layer between the second electrode layer and the source-drain electrode layer. A via hole is provided in the passivation layer. The via hole is filled with a light-emitting material and an orthographic projection of the via hole on the substrate at least partially overlaps an orthographic projection of the first electrode layer on the substrate.

The term "via hole" as used herein refers to a through hole formed in the passivation layer for accommodating the light-emitting material. The light-emitting material filled in the via hole forms the light-emitting layer of the display substrate.

In some embodiments, the substrate is a first flexible substrate.

In some embodiments, the OLED display substrate further comprises a gate layer, a gate insulating layer, an active layer and a buffer layer between the first flexible substrate and the gate layer.

In some embodiments, the first electrode layer comprises a reflective electrode layer, and the second electrode layer is a semi-transmissive semi-reflective electrode layer. In these embodiments, the display substrate has a top-emitting structure. Alternatively, in some embodiments, the first electrode layer is a transparent electrode layer or a semi-transmissive semi-reflective electrode layer, and the second electrode layer comprises the reflective electrode layer. In these embodiments, the display substrate has a bottom-emitting structure.

The term "semi-transmissive semi-reflective electrode layer" as used herein refers to an electrode layer that is both transmissive and reflective for light emitted by the light-emitting layer. Light emitted by the light-emitting layer may be transmitted and reflected by the semi-transmissive semi-reflective electrode layer at any proportion, but it does not mean that exactly 50% of the light is reflected and 50% of the light is transmitted.

In some embodiments, the source-drain electrode layer includes a Mo/Al/LiF layer.

In an exemplary embodiment, the Mo layer has a thickness within a range of 200-600 angstroms, and the Al layer has a thickness within a range of 2000-3000 angstroms. However, instead of being limited to the embodiment disclosed herein, those skilled in the art can design source-drain electrode layers having different thicknesses and compositions according to the teaching of the present disclosure.

In some embodiments, the passivation layer comprises SiNx and SiO.

In some embodiments, the passivation layer has a thickness within a range of 1500-2500 angstroms.

According to another aspect of the present disclosure, an OLED display panel is provided, which comprises any one of the above-mentioned OLED display substrates.

In some embodiments, the OLED display panel further comprises an encapsulation layer on the second electrode layer. The encapsulation layer is configured to protect the OLED display panel from external damage.

In some embodiments, the OLED display panel further comprises a second flexible substrate on the encapsulation layer.

According to still another aspect of the present disclosure, a method for manufacturing an OLED display substrate is provided. The method comprises: forming a source-drain electrode layer and a first electrode layer on a substrate by one patterning process; forming a passivation layer on the source-drain electrode layer and the first electrode layer; forming a light-emitting layer on the passivation layer; and forming a second electrode layer on the light-emitting layer.

In some embodiments, the above method further comprises forming a via hole in the passivation layer before forming the light-emitting layer, and filling the via hole with a light-emitting material so as to form the light-emitting layer. An orthographic projection of the via hole on the substrate at least partially overlaps an orthographic projection of the first electrode layer on the substrate.

In some embodiments, the method further comprises forming a first flexible substrate and a buffer layer in turn on the substrate before forming the source-drain electrode layer and the first electrode layer, and removing the substrate after forming the second electrode layer.

In the process of manufacturing the OLED display substrate, rigid materials like sapphire, glass, etc. are usually used as the substrate to support other layers. In order to obtain the flexible display substrate, the rigid substrate needs to be removed after finishing making other layers.

It shall be noted that all aspects of the present disclosure have similar or same exemplary implementation and benefit, which will not be set forth herein.

These and other aspects of the present disclosure will become apparent from the embodiments described below and will be illustrated in conjunction with the embodiments described below.

DETAILED DESCRIPTION

Figure 1:
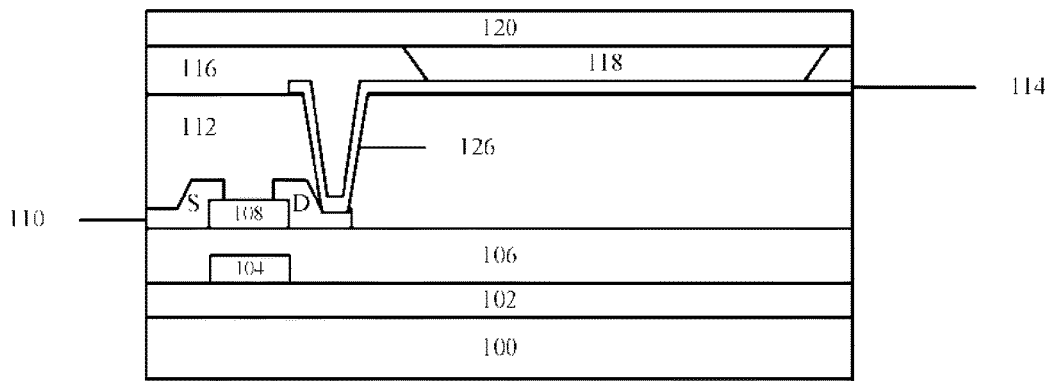
FIG. 1 schematically illustrates a sectional view of a conventional OLED display substrate.

Exemplary embodiments of the present disclosure will be described in detail below with reference to the drawings. The drawings are schematic and are not drawn to scale, and they only intend to illustrate the embodiments of the present disclosure rather than limiting the protection scope of the present disclosure. In the drawings, the same reference signs denote same or similar components. In order to make the technical solution of the present disclosure clearer, technological steps and devices known in the art are omitted herein.

Specific ways of implementation of the OLED display substrate, OLED display panel and method for manufacturing the OLED display substrate will be described below with reference to the drawings by means of examples. The drawings are schematic and are not drawn to scale, and they are only for illustrating the embodiments of the present disclosure rather than limiting the protection scope of the present disclosure.

To facilitate description, such terms as "under", "below", "lower", "above" and "on" indicating spatial relativity can be used to describe the relationship between one element or component and another element or component shown in the figures. It shall be understood that the terms indicating spatial relativity are used to outline different orientations of devices in use or in operation other than the orientations shown in the figures. For example, if a device in the figure is turned over, then elements that have been described as being "under" or "below" other elements or components will be "above" said other elements or components. Thus the exemplary term "under" can imply the two orientations of above and under. Devices may have other orientations (rotating 90 degrees or other orientations), and the descriptors of spatial relativity used herein are explained correspondingly.

FIG. 1 schematically illustrates a sectional view of a conventional OLED display substrate. As shown in FIG. 1, the OLED display substrate comprises a substrate 100, a buffer layer 102 on the substrate, a gate layer 104, a gate insulating layer 106, an active layer 108, a source-drain electrode layer 110, a passivation layer 112, a first electrode layer 114, a light-emitting layer 118 and a second electrode layer 120. The gate layer 104, gate insulating layer 106, source S, drain D and the active layer 108 form a transistor.

The OLED display substrate further comprises a pixel definition layer 116. The pixel definition layer 116 is usually a net-like structure, wherein "meshes" of said net-like structure correspond to respective pixels, and corresponding light-emitting materials of the pixels are kept in pixel regions, while mesh walls of said net-like structure are used for delimiting the pixels. As shown in FIG. 1, the pixel definition layer 116 keeps the light-emitting layer 118 above the first electrode layer 114 of the corresponding pixel.

In the OLED display substrate shown in FIG. 1, a via hole 126 is needed to electrically connect the drain D of the transistor to the first electrode layer 114 so as to apply current to the light-emitting layer 118 through the transistor. In the actual process, however, the electrically conductive material filled in the via hole might fracture, resulting in an interruption in the electrical connection between the first electrode layer 114 and the drain D, so it is impossible to apply current to the light-emitting material 118 through the transistor. On the other hand, since the first electrode layer 114 electrically contact the drain D indirectly through the via hole 126, there might be a contact resistance therebetween, which influences the electrical performance of the OLED display substrate.

Figure 2:
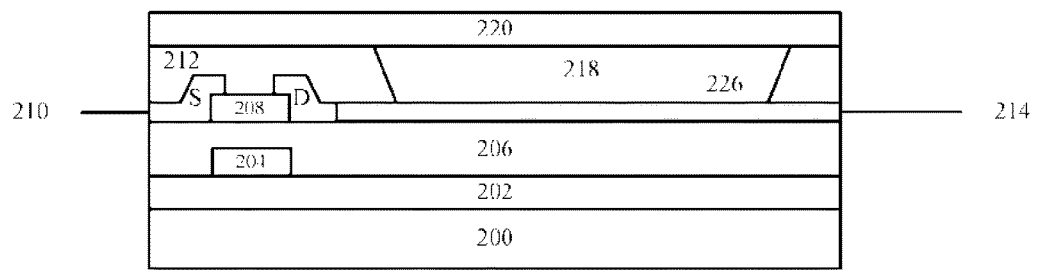
FIG. 2 schematically illustrates a sectional view of an OLED display substrate according to an embodiment of the present disclosure.

Accordingly, an embodiment of the present disclosure provides an OLED display substrate. As shown in FIG. 2, the OLED display substrate comprises a substrate 200; a gate layer 204, a gate insulating layer 206, an active layer 208, a source-drain electrode layer 210 and a first electrode layer 214 above the substrate 200; a light-emitting layer 218; and a second electrode layer 220, wherein the source-drain electrode layer 210 and the first electrode layer 214 are at the same layer. The gate layer 204, gate insulating layer 206, source S, drain D and active layer 208 form a transistor.

The display substrate further comprises a passivation layer 212 between the second electrode layer 220 and the source-drain electrode layer 210. A via hole 226 is provided in the passivation layer 212, and the via hole 226 is filled with a light-emitting material to form the light-emitting layer 218. An orthographic projection of the via hole 226 on the substrate 200 at least partially overlaps an orthographic projection of the first electrode layer 214 on the substrate 200.

In the OLED display substrate, by making the source-drain electrode layer 210 and the first electrode layer 214 to be at the same layer, it is unnecessary to electrically connect the first electrode layer and the source-drain electrode layer using a via hole, thus avoiding any display substrate function failure caused by such phenomena as via hole fracture, and avoiding the problem of contact impedance resulted from the indirect contact between the first electrode layer 214 and the source-drain electrode layer 210 through the via hole. Further, if the source-drain electrode layer and the first electrode layer are made of the same material, then forming the source-drain electrode layer 210 and the first electrode layer 214 at the same layer can reduce process steps of patterning and simplify process flow, thereby reducing manufacturing cost and increasing manufacturing efficiency. In addition, compared to the OLED display substrate shown in FIG. 1, thickness of the entire OLED display substrate can be reduced, thus making the OLED display substrate light and thin.

Moreover, by arranging the light-emitting layer 218 in the passivation layer 212, the pixel definition layer is no longer necessary, thus further reducing the thickness of the entire OLED display substrate and making the OLED display substrate light and thin.

In FIG. 2, the substrate 200 can be a first flexible substrate. Such OLED display substrate can be used for realizing a flexible display panel. The OLED display panel can be made lighter and thinner as compared to the OLED display substrate shown in FIG. 1, so the resulting OLED display panel can be more flexible.

Further, as shown in FIG. 2, the OLED display substrate may optionally further comprise a buffer layer 202 disposed between the first flexible substrate 200 and the gate layer 204. The buffer layer 202 can prevent moisture and oxygen from permeating into the gate layer 204 and affecting the performance of the OLED display substrate.

In some exemplary embodiments, the first electrode layer 214 comprises a reflective electrode layer, and the second electrode layer 220 is a semi-transmissive semi-reflective electrode layer. In this case, the display substrate has a top-emitting structure. Alternatively, the first electrode layer 214 is a transparent electrode layer or a semi-transmissive semi-reflective electrode layer, and the second electrode layer 220 comprises a reflective electrode layer. In this case, the display substrate has a bottom-emitting structure. The reflective electrode layer can prevent light emitted by the light-emitting layer from exiting in other directions than a light exiting side of the display substrate, thereby increasing light utilization rate and improving brightness and performance of the OLED display substrate. The transparent electrode layer or the semi-transmissive semi-reflective electrode layer allows light to pass through it to exit in a light exiting side of the OLED display substrate, thereby realizing display.

The source-drain electrode layer 210 includes a Mo/Al/LiF layer, wherein the Mo layer has a thickness within a range of 200-600 angstroms, and the Al layer has a thickness within a range of 2000-3000 angstroms. The passivation layer 212 includes SiNx and SiO, and has a thickness within a range of 1500-2500 angstroms, which is sufficient to accommodate the light emitting layer 218. The passivation layer having a thickness within this range can on one hand well accommodate the light-emitting layer to make the display substrate to have good light-emitting efficiency and display performance, and on the other hand, can help to make the display substrate light and thin.

Aluminum (Al) is usually used to make data lines and the first electrode layer of the OLED display substrate due to its good electrical conductivity and low price. However, an Al layer usually cannot be well adhered to the active layer, so a molybdenum (Mo) layer is used to improve adhesion between the Al layer and the active layer. In addition, a lithium fluoride (LiF) layer can reduce the barrier between the Al layer and the light-emitting layer, improve carrier injection efficiency and reduce exciton quenching probability, thereby improving stability and reliability of the OLED display substrate.

Figure 3:
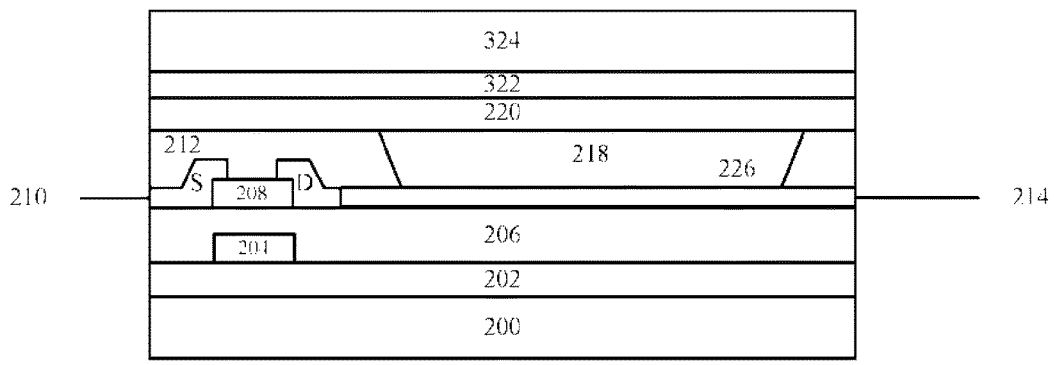
FIG. 3 schematically illustrates a sectional view of an OLED display panel according to an embodiment of the present disclosure.

FIG. 3 schematically illustrates an OLED display panel according to an embodiment of the present disclosure. As shown in FIG. 3, the OLED display panel comprises the OLED display substrate as shown in FIG. 2 and an encapsulation layer 322 on the second electrode layer 220. The encapsulation layer 322 is configured to protect the OLED display panel from external damage. When the substrate 200 of the OLED display substrate is the first flexible substrate, the OLED display panel further comprises a second flexible substrate 324 on the encapsulation layer 322. The second flexible substrate 324 cooperates with the first flexible substrate 200 of the OLED display substrate so as to obtain a flexible OLED display panel. The OLED display panel according to the embodiment of the present disclosure can be made lighter and thinner as compared to that of the prior art, so it can be more flexible.

In such an OLED display panel, by making the source-drain electrode layer 210 and the first electrode layer 214 of the OLED display substrate to be at the same layer, it is unnecessary to electrically connect the first electrode layer 214 and the source-drain electrode layer 210 using a via hole, thus avoiding any display substrate function failure caused by such phenomena as via hole fracture, and avoiding the problem of contact impedance resulted from the indirect contact between the first electrode layer 214 and the source-drain electrode layer 210 through the via hole. Further, if the source-drain electrode layer and the first electrode layer are made of the same material, then forming the source-drain electrode layer 210 and the first electrode layer 214 at the same layer can reduce process steps of patterning and simplify process flow, thereby reducing manufacturing cost and increasing manufacturing efficiency. In addition, thickness of the entire OLED display panel can be reduced, thus making the OLED display panel light and thin.

It shall be noted that although FIG. 1, FIG. 2 and FIG. 3 only schematically show only one pixel of the OLED display substrate, as is known to those skilled in the art, the OLED display substrate may comprise any number of pixels as desired. Besides, although FIG. 2 and FIG. 3 schematically show the OLED display substrate having a bottom gate structure, the concept of the present disclosure can also be applied to an OLED display substrate having a top gate structure.

Figure 4:
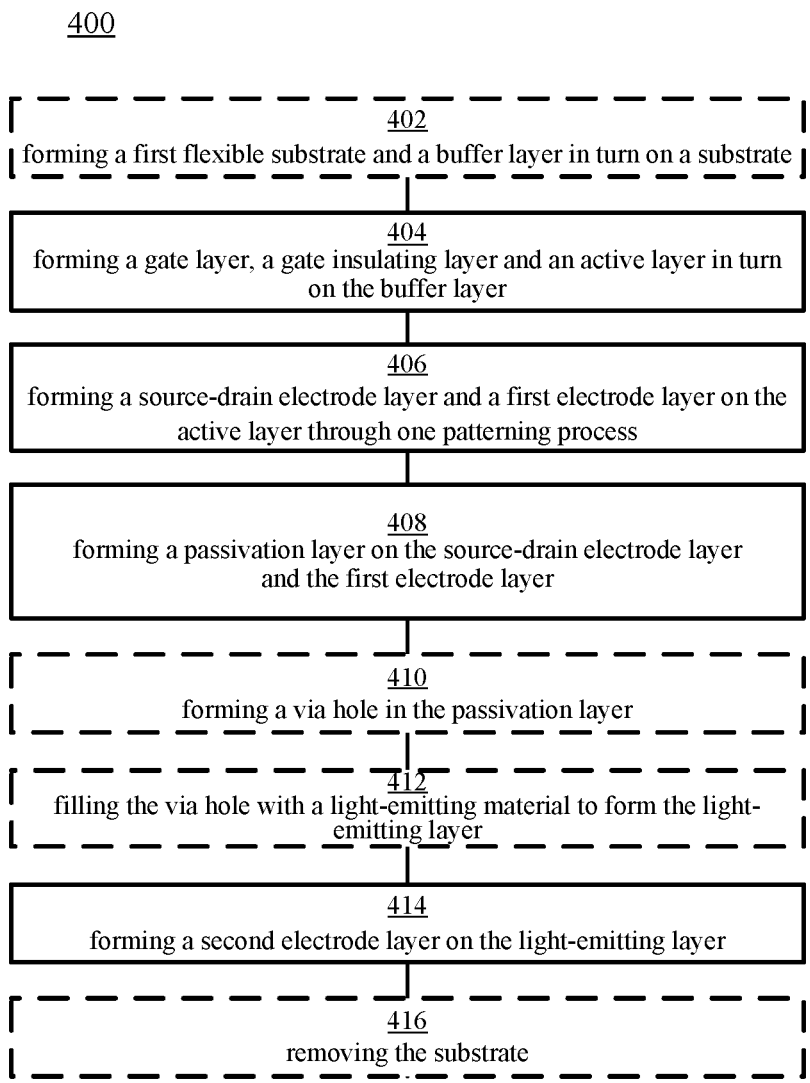
FIG. 4 schematically illustrates a flow chart of a method for manufacturing an OLED display substrate according to an embodiment of the present disclosure.

An embodiment of the present disclosure further provides a method 400 for manufacturing an OLED display substrate. As shown in FIG. 4, the method 400 comprises forming a first flexible substrate and a buffer layer in turn on a substrate in step 402. The first flexible substrate can be made by means of laminating or coating using a polyimide (PI) material. The buffer layer can be made by the plasma enhanced chemical vapor deposition (PECVD) process.

In step 404, a gate layer, a gate insulating layer and an active layer are formed on the buffer layer. The gate layer can be made by sputtering and patterning processes, and the gate insulating layer and active layer can be made by PECVD and patterning processes.

In step 406, a source-drain electrode layer and a first electrode layer are formed on the active layer through one patterning process. The source-drain electrode layer and first electrode layer can be made by sputtering and patterning processes, and can be made using the same material in one process, thereby simplifying the process and reducing the manufacturing cost.

In step 408, a passivation layer is formed on the source-drain electrode layer and the first electrode layer. The passivation layer can be made by the PECVD process using SiNx and SiO so as to protect the source-drain electrode layer.

In step 410, a via hole is formed in the passivation layer, so that an orthographic projection of the via hole on the substrate at least partially overlaps an orthographic projection of the first electrode layer on the substrate. The via hole can be made by photolithography or dry etching.

In step 412, the via hole is filled with a light-emitting material to form the light-emitting layer. The light-emitting layer can be made by evaporating or ink-jet printing.

In step 414, a second electrode layer is formed on the light-emitting layer. The second electrode layer can be made by sputtering.

Finally, in step 416, the substrate is removed. Removal of the substrate can be realized by mechanical peeling or laser peeling, and when laser peeling is used, the first flexible substrate might be denaturalized by laser and thus cannot effectively block permeation of moisture and oxygen, so a buffer layer that can prevent permeation of moisture and oxygen is necessary.

In the OLED display substrate made by the above method, by making the source-drain electrode layer and the first electrode layer to be at the same layer, a step of making a via hole to electrically connect the first electrode layer and the source-drain electrode layer can be omitted, thus avoiding any display substrate function failure caused by such phenomena as via hole fracture, and avoiding the problem of contact impedance resulted from the indirect contact between the first electrode layer and the source-drain electrode layer through the via hole. Further, if the source-drain electrode layer and the first electrode layer are made of the same material, then forming the source-drain electrode layer and the first electrode layer at the same layer can reduce process steps of patterning and simplify process flow, thereby reducing manufacturing cost and increasing manufacturing efficiency. In addition, the thickness of the entire OLED display substrate can be reduced, thus making the OLED display substrate light and thin.

Moreover, in above-mentioned method, by forming the light-emitting layer in the passivation layer, a step of forming a pixel definition layer can be omitted, thus simplifying the process flow and reducing manufacturing cost, and further reducing the thickness of the entire OLED display substrate and making the OLED display substrate light and thin.

In the method 400, steps 402 and 416 can both be omitted, and steps 410 and 412 can both be omitted. When steps 402 and 416 are both omitted, the gate layer is directly formed on the substrate, and the resulting OLED display substrate is a non-flexible OLED display substrate. When steps 410 and 412 are both omitted, the light-emitting layer is formed above the passivation layer instead of in the passivation layer.

Those skilled in the art shall understand that this disclosure is not limited to the above-described exemplary embodiments. Rather, many modifications and variations are possible within the scope of the appended claims. In addition, the above-described process does not require to achieve the expected result with the described specific order or sequence. Other steps may be provided, or steps can be removed from the described process.

The concept of the present disclosure can be widely applied to any system having a display function, including a desktop computer, a laptop computer, a mobile phone, a tablet computer, and particularly, a flexible display system. In addition, although several embodiments have been described in detail herein, other modifications are possible. For example, components can be added to or removed from the described system. Other embodiments may fall within the scope of the present disclosure. Under the teaching of the present disclosure, those skilled in the art can realize many variations and modifications without departing from the spirit and scope of the present disclosure.

The invention claimed is:

1. An OLED display substrate, comprising: a substrate, a source-drain electrode layer and a first electrode layer above the substrate, a light-emitting layer, and a second electrode layer, wherein the source-drain electrode layer and the first electrode layer are at the same layer and have the same material and wherein the source-drain electrode layer includes a Mo/Al/LiF layer.

2. The display substrate according to claim 1, further comprising: a passivation layer between the second electrode layer and the source-drain electrode layer, a via hole being provided in the passivation layer, the via hole being filled with a light-emitting material, and an orthographic projection of the via hole on the substrate at least partially overlapping an orthographic projection of the first electrode layer on the substrate.

3. The display substrate according to claim 2, wherein the passivation layer comprises SiNx and SiO.

4. The display substrate according to claim 3, wherein the passivation layer has a thickness within the range of 1500-2500 angstroms.

5. The display substrate according to claim 1, wherein the substrate is a first flexible substrate.

6. The display substrate according to claim 5, further comprising: a gate layer, a gate insulating layer, an active layer, and a buffer layer between the first flexible substrate and the gate layer.

7. The display substrate according to claim 1, wherein the first electrode layer comprises a reflective electrode layer, and the second electrode layer is a semi-transmissive semi-reflective electrode layer.

8. The display substrate according to claim 1, wherein the first electrode layer is transparent electrode layer or a semi-transmissive semi-reflective electrode layer, and the second electrode layer comprises a reflective electrode layer.

9. The display substrate according to claim 1, wherein the Mo layer has a thickness within the range of 200-600 angstroms.

10. The display substrate according to claim 1, wherein the Al layer has a thickness within the range of 2000-3000 angstroms.

11. An OLED display panel, comprising: the OLED display substrate according to claim 1.

12. The display panel according to claim 11, further comprising: an encapsulation layer on the second electrode layer.

13. The display panel according to claim 12, further comprising: a second flexible substrate on the encapsulation layer.

14. The display panel according to claim 11, further comprising: a passivation layer between the second electrode layer and the source-drain electrode layer, a via hole being provided in the passivation layer, the via hole being filled with a light-emitting material, and an orthographic projection of the via hole on the substrate at least partially overlapping an orthographic projection of the first electrode layer on the substrate.

15. The display panel according to claim 11, wherein the substrate is a first flexible substrate.

16. The display panel according to claim 15, further comprising: a gate layer, a gate insulating layer, an active layer, and a buffer layer between the first flexible substrate and the gate layer.

17. A method of manufacturing an OLED display substrate, comprising:
    forming a source-drain electrode layer and a first electrode layer on a substrate through one patterning process, wherein the source-drain electrode layer includes a Mo/Al/LiF layer;
    forming a passivation layer on the source-drain electrode layer and the first electrode layer;

forming a light-emitting layer on the passivation layer; and forming a second electrode layer on the light-emitting layer.

18. The method according to claim 17, further comprising:

forming a via hole in the passivation layer before forming the light-emitting layer; and filling the via hole with a light-emitting material, wherein an orthographic projection of the via hole on the substrate at least partially overlaps an orthographic projection of the first electrode layer on the substrate.

19. The method according to claim 17, further comprising:

forming a first flexible substrate and a buffer layer in turn on the substrate before forming the source-drain electrode layer and the first electrode layer; and removing the substrate after forming the second electrode layer.

* * * * *